US012656386B2

(12) United States Patent
    Guillot et al.

(10) Patent No.:     US 12,656,386 B2
(45) Date of Patent:         Jun. 16, 2026

(54) MONITORING OF A TRANSMISSION LINE

(71) Applicant: SAFRAN ELECTRONICS & DEFENSE, Paris (FR)

(72) Inventors: Francois Guillot, Moissy-Cramayel (FR); Patrice Chetanneau, Moissy-Cramayel (FR)

(73) Assignee: SAFRAN ELECTRONICS & DEFENSE, Paris (FR)

( * ) Notice:   Subject to any disclaimer, the term of this patent is extended or adjusted under 35 U.S.C. 154(b) by 340 days.

(21) Appl. No.:    18/257,828

(22) PCT Filed:    Dec. 17, 2021

(86) PCT No.:    PCT/FR2021/052396
    § 371 (c)(1),
    (2) Date:    Jun. 15, 2023

(87) PCT Pub. No.:   WO2022/136783
    PCT Pub. Date: Jun. 30, 2022

(65)            Prior Publication Data
    US 2024/0053396 A1      Feb. 15, 2024

(30)         Foreign Application Priority Data
    Dec. 21, 2020    (FR) ...................................... 2013812

(51) Int. Cl.
    *G01R 31/08*        (2020.01)
    *G01R 31/00*        (2006.01)
(52) U.S. Cl.
    CPC ......... *G01R 31/085* (2013.01); *G01R 31/008* (2013.01); *G01R 31/088* (2013.01)
(58) Field of Classification Search
    CPC ... G01R 31/085; G01R 31/008; G01R 31/088
    See application file for complete search history.

(56)             References Cited

U.S. PATENT DOCUMENTS 6,984,979 B1 *   1/2006  Edel ..................... G01R 15/185
                                                    324/253
    7,626,834 B2 *  12/2009  Chisenga .......... H02M 3/33592
                                                    363/25
                (Continued)

FOREIGN PATENT DOCUMENTS

EP         1316134 A1     6/2003
    EP         1889377 A2     2/2008
                (Continued)

OTHER PUBLICATIONS

International Search Report and Written Opinion received for PCT Patent Application No. PCT/FR2021/052396, mailed on May 19, 2022, 22 pages (11 pages of English Translation and 11 pages of Original Document).
                (Continued)

*Primary Examiner* — Catherine T. Rastovski
*Assistant Examiner* — Nyla Gavia
(74) *Attorney, Agent, or Firm* — Womble Bond Dickinson (US) LLP

(57)            ABSTRACT
A system including a coupling device and a data processing device designed to supply an excitation signal (SE) so that an internal signal (Φ) occurs in the coupling device, this internal signal (Φ) having a deformation resulting from the current to be measured (I0), obtain a measured signal (Sm) for a variable (Vm) sensitive to the deformation, supply a compensation signal (Sc) in order to cancel out the deformation, and evaluate the current to be measured (I0) based on the compensation signal (Sc). The data processing device is furthermore designed to analyse the measured signal (Sm) and to detect a fault on the trans-mission line based on this analysis.

19 Claims, 10 Drawing Sheets

(56)            References Cited

U.S. PATENT DOCUMENTS

| | | | |
|---|---|---|---|
| 10,203,363 B2 * | 2/2019 | Premerlani | ............ G01R 31/52 |
| 2012/0051444 A1 | 3/2012 | Steiner et al. | |
| 2020/0185902 A1 | 6/2020 | Jakupi et al. | |
| 2021/0247435 A1 * | 8/2021 | Haynes | .............. G01R 19/2513 |
| 2021/0255222 A1 | 8/2021 | Chetanneau et al. | |

FOREIGN PATENT DOCUMENTS

| | | | | |
|---|---|---|---|---|
| EP | 1889377 B1 * | 11/2012 | ........... H04L 1/0054 |
| FR | 2930041 A1 * | 10/2009 | ............. H02H 3/347 |
| FR | 3083321 A1 | 1/2020 | |
| FR | 3083365 A1 | 1/2020 | |
| JP | 2014130061 A * | 7/2014 | |
| WO | 02/21664 A1 | 3/2002 | |
| WO | WO-2020002184 A1 * | 1/2020 | ............. G01R 33/04 |

OTHER PUBLICATIONS

First Office Action for Chinese patent application No. 202180085675.9, Mar. 31, 2026, 7 pages, including English Translation.

* cited by examiner

[Fig. 1]
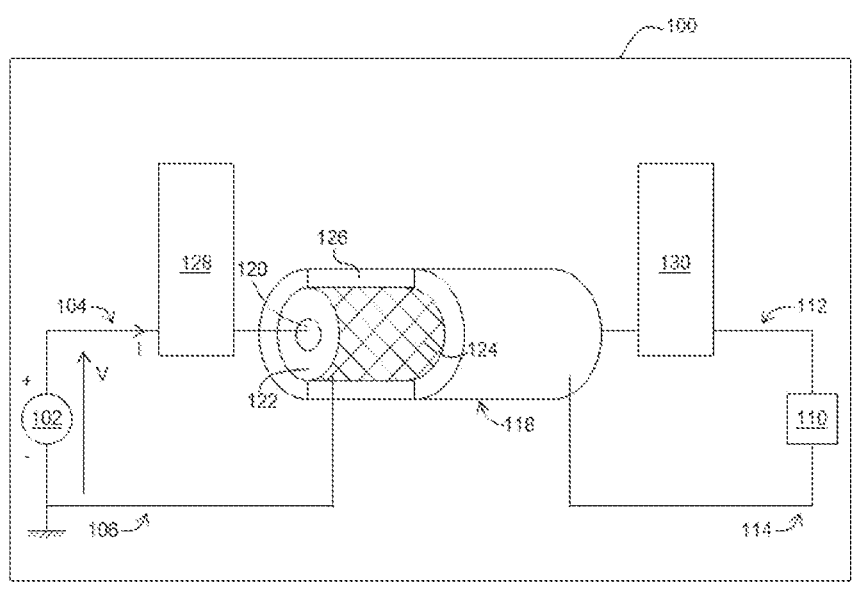

[Fig. 2]
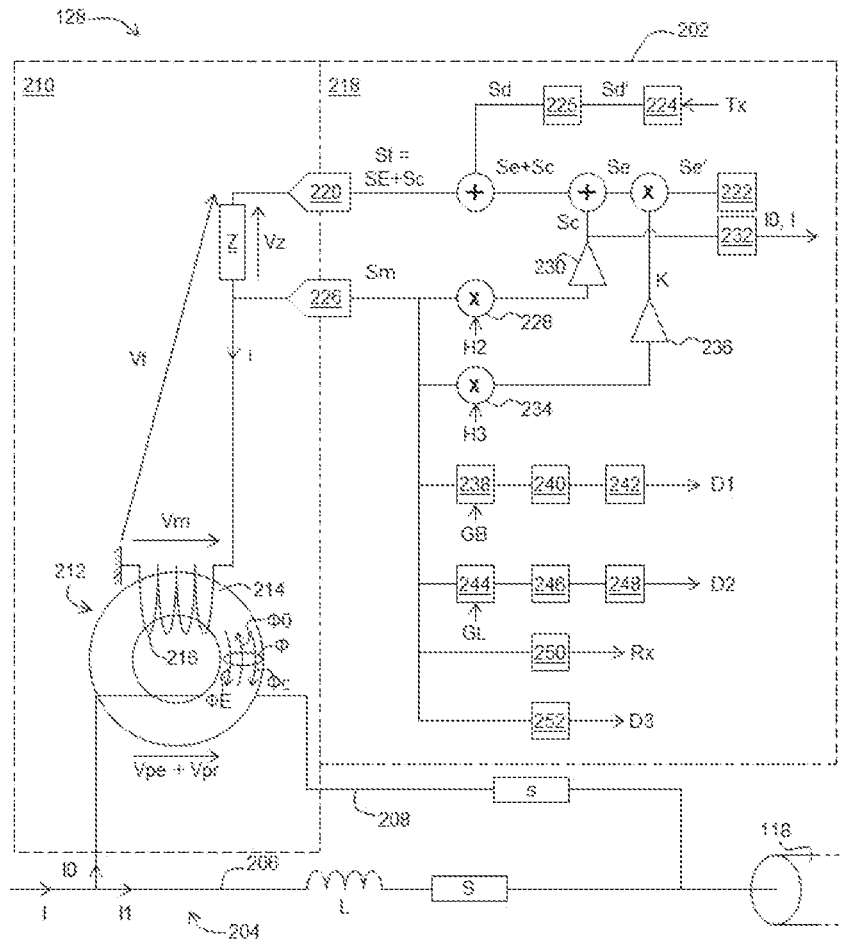

[Fig. 3]
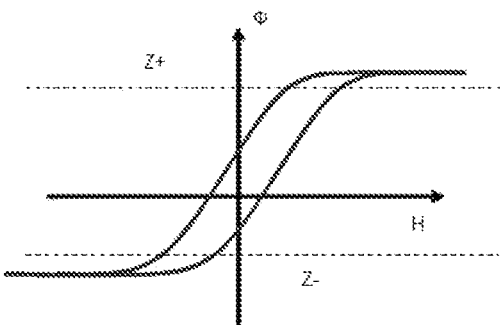

[Fig. 4]
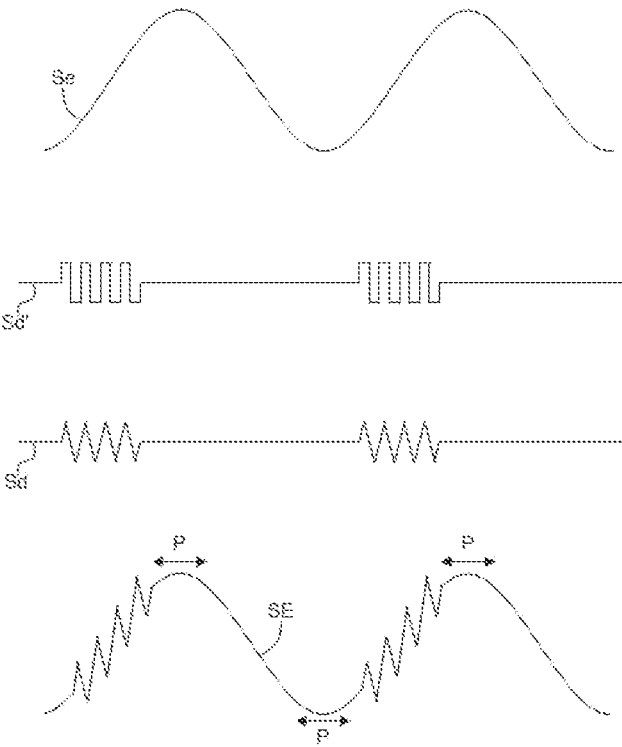

[Fig. 5]
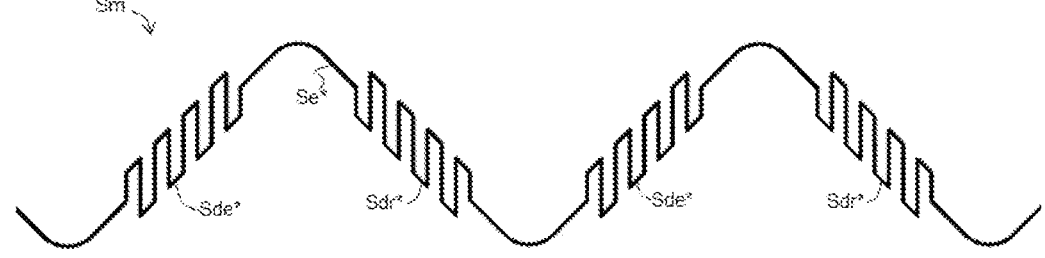

[Fig. 6]
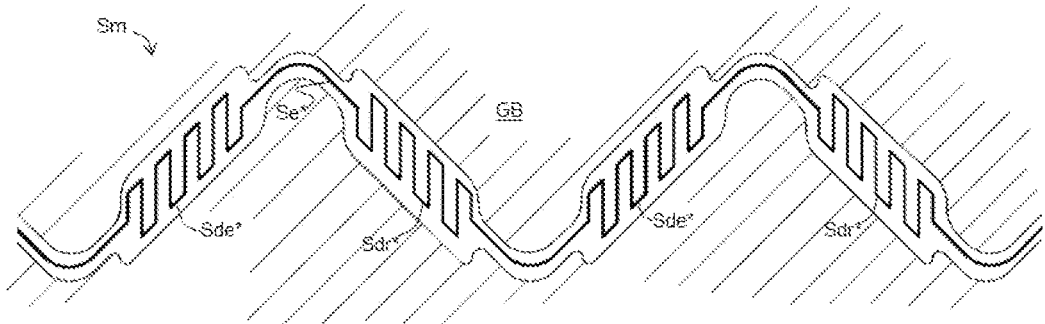

[Fig. 7]
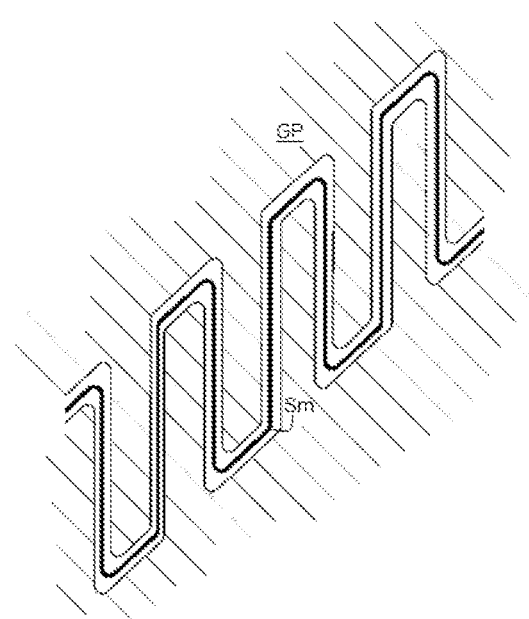

[Fig. 8]
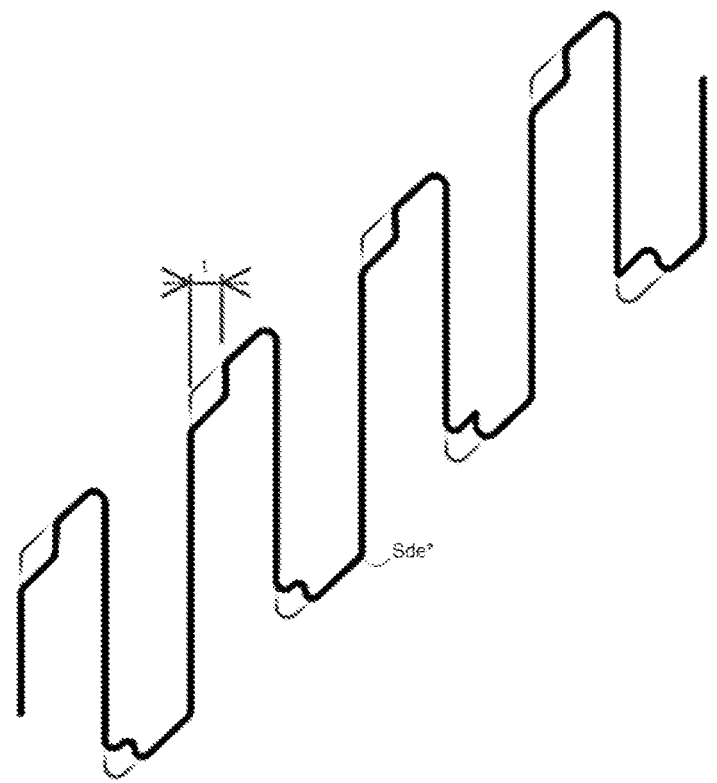

[Fig. 9]
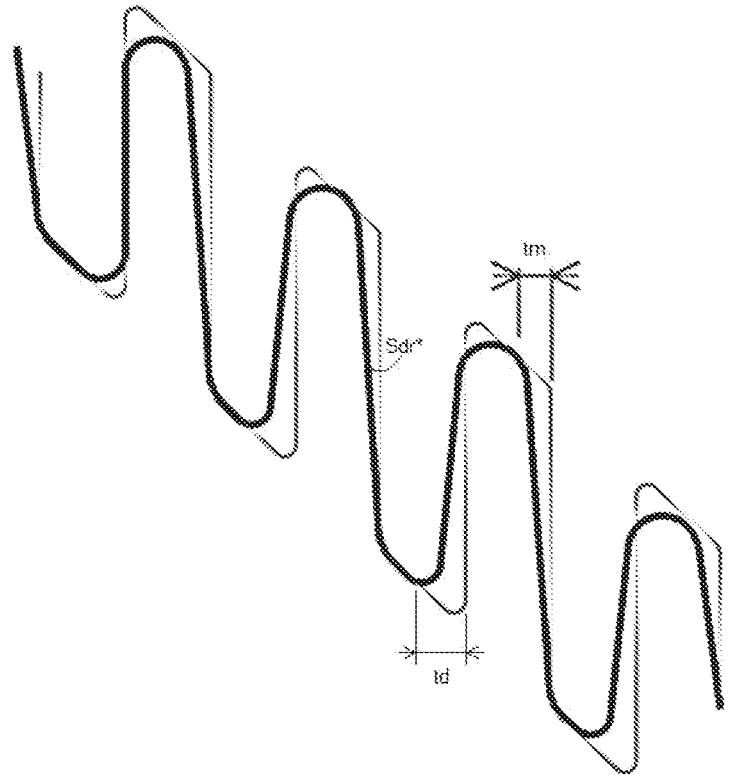

[Fig. 10]
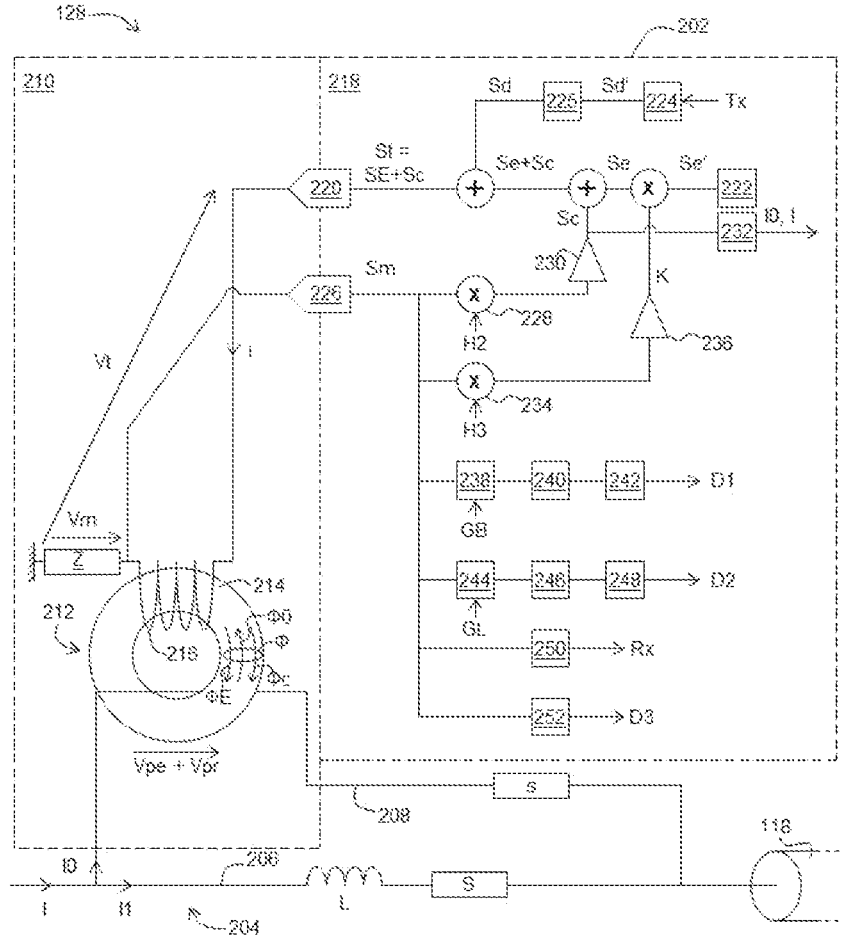

MONITORING OF A TRANSMISSION LINE

TECHNICAL FIELD OF THE INVENTION

This invention relates to the monitoring of a transmission line. More specifically, it relates to a system for monitoring a transmission line, an electrical distribution system comprising such a monitoring system, an aircraft comprising such a distribution system, a method for monitoring a transmission line and a corresponding computer program.

Technological Background

The documents FR 3 083 321 A1 and FR 3 083 365 A1 each describe a system for monitoring a transmission line, of the type comprising:
  a coupling device connected to the transmission line to receive a current from the transmission line;
  a data processing device connected to the coupling device and designed for:
    supplying an excitation signal to the coupling device so that an internal signal appears in the coupling device, this internal signal having a deformation resulting from the current to be measured,
    obtaining a signal for measuring a variable in the coupling device which is sensitive to the deformation of the internal signal,
    supplying a compensation signal to the coupling device from the measurement signal to cancel the deformation; and
    evaluating the current to be measured from the compensation signal.

More specifically, in these documents, the monitoring system comprises a flux valve current sensor.

It may be desirable to provide a system for monitoring a transmission line which allows a better monitoring without multiplying the measuring devices.

SUMMARY OF THE INVENTION

A system for monitoring a transmission line, of the aforementioned type, is therefore proposed, characterised in that, the measurement signal also being sensitive to the presence of a fault on the transmission line, the data processing device is also designed to analyse the measurement signal and to detect, from this analysis, a fault on the transmission line.

Thus, in addition to allow the measurement of the current on the transmission line, the monitoring system according to the invention allows to detect a fault on the transmission line using the elements already present for the current measurement.

Optionally, the coupling device comprises a transformer with a ferromagnetic core, the internal signal being a total magnetic flux present in the core and combining an excitation magnetic flux resulting from the excitation signal, a current magnetic flux resulting from the current to be measured and a compensation magnetic flux resulting from the compensation signal so as to substantially cancel the current magnetic flux.

Also optionally, the analysis of the measurement signal comprises the comparison of the measurement signal with at least one template and the detection of the fault on the transmission line is carried out from instants at which the measurement signal is outside at least one of the template or templates.

Also optionally, the excitation signal also comprises an oscillating signal.

Also optionally, the oscillating signal comprises a sum of a sinusoid at a fundamental frequency and a sinusoid at the third harmonic, i.e., at three times the fundamental frequency.

Also optionally, the excitation signal generating, through the coupling device, a signal propagating on the transmission line, the data processing device is further designed to encode data to be transmitted into an encoded signal and the excitation signal comprises the encoded signal so that the propagating signal includes the data to be transmitted.

Also optionally, the encoded signal has a mean of zero.

Also optionally, the encoded signal has a higher fundamental frequency than the oscillating signal.

Also optionally, the at least one template comprises a global template which tracks, on the one hand, variations in an oscillating signal of the measurement signal resulting from the oscillating signal of the excitation signal and, on the other hand, an envelope of an encoded signal of the measurement signal resulting from the encoded signal of the excitation signal.

Also optionally, the at least one template comprises a local template tracking variations in an encoded signal of the measurement signal resulting from the encoded signal of the excitation signal.

Also optionally, the oscillating signal comprises a sequence of rises and falls and wherein the encoded signal is present on only one of the rises and the falls.

Also optionally, the measurement signal comprises a sequence of rises and falls corresponding respectively to the rises and falls of the oscillating signal and wherein the data processing device is further designed to decode an encoded signal present on the other of the rises and the falls of the measurement signal.

Optionally, the transmission line is also a coaxial cable.

Also proposed is an electrical distribution system comprising:—
  an electrical source;
  an electrical load;
  a transmission line connecting the electrical load to the electrical source, so that the electrical source supplies electrical power to the electrical load;
  a system for monitoring the transmission line, according to the invention.

Also optionally, the electrical source is a DC voltage source, preferably greater than 100 V.

An aircraft comprising an electrical distribution system according to the invention is also proposed.

Also proposed is a method for monitoring a transmission line, using a coupling device connected to the transmission line to receive a current from the transmission line, comprising:
  supplying an excitation signal to the coupling device so that an internal signal appears in the coupling device, this internal signal having a deformation resulting from the current to be measured,
  obtaining a signal for measuring a variable in the coupling device which is sensitive to the deformation of the internal signal,
  supplying a compensation signal to the coupling device from the measurement signal to cancel the deformation; and
  evaluating the current to be measured from the compensation signal;
  characterised in that, the measurement signal being additionally sensitive to the presence of a fault on the transmission line, the method further comprises analysing the measurement signal and detecting, from this analysis, a fault on the transmission line.

Also proposed is a computer program that can be downloaded from a communications network and/or stored on a computer-readable medium, characterised in that it comprises instructions for executing the steps of a method according to the invention, when said program is executed on a computer.

BRIEF DESCRIPTION OF THE FIGURES

The invention will be better understood with the aid of the following description, given only by way of example and made with reference to the attached drawings in which:

FIG. 1 is a schematic view of an electrical distribution system implementing the invention, this electrical distribution system comprising a transmission line, FIG. 2 is a schematic view of a system for monitoring the transmission line of FIG. 1, FIG. 3 is a graph illustrating a saturation of a magnetic flux in a ferromagnetic core, FIG. 4 illustrates the sum of signals to form an excitation signal, FIG. 5 shows a signal measured by the monitoring system, FIG. 6 shows a first template surrounding the signal measured by the monitoring system, FIG. 7 shows a second template surrounding the signal measured by the monitoring system, FIG. 8 illustrates a deformation in the measured signal resulting from a first fault in the transmission line, FIG. 9 shows a deformation in the measured signal resulting from a second fault in the transmission line, and FIG. 10 is a schematic view of a system for monitoring the transmission line of FIG. 1, according to another embodiment.

DETAILED DESCRIPTION OF THE INVENTION

With reference to FIG. 1, an example of an electrical distribution system 100 implementing the invention will now be described.

In the example described, the electrical distribution system 100 is intended for implementation in an aircraft.

The system 100 firstly comprises an electrical source 102 designed to supply a DC voltage V. Preferably, the DC voltage V is a high voltage, for example of at least 100 V, and even more preferably of at least 1000 V. The electrical source 102 thus comprises a positive "+" terminal and a negative "−" terminal between which the DC voltage V is supplied. The electrical source 102 is designed, for example, to supply an electrical power of at least 100 kW. The electrical source 102 comprises, for example, one or more of: a battery, an alternator driven by a turbine (engine or auxiliary generator), a fuel cell and a super capacitor.

The system 100 also comprises a first positive connection 104 and a first negative connection 106, connected respectively to the positive terminal and to the negative terminal of the voltage source 102.

The system 100 also comprises an electrical load 110 intended to be supplied electrically by the electrical source 102. The aircraft 100 comprises second positive 112 and negative 114 connections, connected respectively to two terminals of the electrical load 110. The electrical load 110 comprises, for example, one or more of: an electric propulsion motor, an electric landing gear or flight control motor and a de-icing heating resistor.

To transmit the electrical energy from the electrical source 102 to the electrical load, the aircraft 100 also comprises a transmission line connecting, on the one hand, the two positive connections 104, 112 to each other and, on the other hand, the two negative connections 106, 114 to each other.

Preferably, the transmission line is a coaxial cable 118. This coaxial cable 118 firstly comprises a conductive central core 120, and a first dielectric sheath 122, referred to as internal, surrounding the central core 120. The coaxial cable 118 also comprises a shielding 124 surrounding the first dielectric sheath 122. The shielding 124 is, for example, in the form of a cylindrical mesh. The coaxial cable 118 also comprises a second dielectric sheath 126, referred to as external, surrounding the shielding 124.

The positive connections 104, 112 are thus connected to each other by the central core 120, while the negative connections 106, 114 are connected to each other by the shielding 124. In this way, the central core 120 convey a supply current I from the electrical source 102 to the electrical load 110, while the shielding 124, which is conductive, is used as a current return line from the electrical load 110 to the electrical source 102.

The coaxial cable 118 has the particular advantage of having an iterative impedance, i.e., the electrical properties of the coaxial cable remain substantially constant over its entire length. Other types of transmission line could also have this property. Another advantage of the coaxial cable 118 is that the shielding 124, which is at low potential, surrounds the central core 120, which is at high potential. This means that if the coaxial cable 118 is damaged, it is the shielding 124 that becomes visible first. However, because it is at low potential, there is little risk of people touching the shielding. More specifically, this low potential can be very close to the potential of the structure of the aircraft (for example, less than 10 V). Under these conditions, the risk of electrocution is practically zero.

Such a transmission line can therefore be easily used in an aircraft with a structure made of composite materials, which are electrically insulating and therefore cannot act as an electrical mass forming a current return line.

The system 100 also comprises first and second systems 128, 130 for monitoring the transmission line 118 arranged on the first and second positive connections 104, 112 respectively.

With reference to FIG. 2, an example of the implementation of the monitoring system 128 will now be described, the monitoring system 130 being for example similar to the monitoring system 128.

The monitoring system 128 firstly comprises a current sensor 202 with a flux valve.

The current sensor 202 is designed to measure the supply current I. As the latter can be very high, the current sensor 202 firstly comprises, in the example described, a current divider 204 comprising, on the one hand, a main branch 206 through which a major part I1 of the supply current I is intended to pass and, on the other hand, an auxiliary branch 208 through which a small part I0 of the supply current I, referred to as the auxiliary current I0, is intended to pass. The main branch 206 has a resistance S, while the auxiliary branch has a resistance S, much smaller than the resistance S. An inductance L is also provided on the main branch 206.

The auxiliary current I0 and the supply current I have a generally known and stationary ratio. By measuring the auxiliary current I0, the supply current I can be deduced.

The current sensor 202 also comprises a coupling device 210 connected to the transmission line 118 to receive the auxiliary current I0 from the transmission line 118.

In the example described, the coupling device 210 firstly comprises a transformer 212 comprising a closed-loop ferromagnetic core 214, through which the auxiliary branch 208 passes in order to form a primary of the transformer 212.

The transformer 212 also comprises a coil 216 wound around the core 214 and forming a secondary of the transformer 212. This coil 216 has two ends, one of which is connected to an electrical mass.

The coupling device 210 also comprises an impedance Z, for example a resistor, which in the example shown in FIG. 2 is connected to a second end of the coil 216.

FIG. 3 illustrates the evolution of a total magnetic flux $\Phi$ in the core 214 as a function of an excitation H of this core 214. As can be seen, this evolution shows two saturation areas of the total magnetic flux $\Phi$: a saturation area, referred to as positive Z+, when the total magnetic flux $\Phi$ becomes very large positively, and a saturation area, known as negative Z−, when the total magnetic flux $\Phi$ becomes very large negatively. In each saturation area Z+, Z−, the total magnetic flux $\Phi$ increases less and less (positively or negatively depending on the area) despite an increasingly strong excitation H. On the contrary, between the saturation areas Z+, Z−, the total magnetic flux $\Phi$ evolves substantially linearly (neglecting the hysteresis phenomenon) as a function of the excitation H.

Returning to FIG. 2, when the auxiliary current I0 is non-zero, it causes a magnetic flux of current $\Phi0$ to appear in the core 214. Generally, the supply current I is relatively constant, as is the auxiliary current I0. As a result, the magnetic current flux $\Phi0$ is also relatively constant.

The current sensor 202 also comprises a data processing device 218 designed to use the coupling device 210 to measure the auxiliary current I0, and therefore the supply current I.

The device 218 is, for example, a computer system comprising a data processing unit (such as a microprocessor) and a main memory (such as a RAM memory (Random Access Memory)) accessible by the processing unit. The computer system also preferably comprises a non-volatile memory such as a EEPROM (Electrically Erasable Programmable Read Only Memory), a PROM-Flash (Programmable Read Only Memory Flash), M-RAM (Magnetoresistive Random-Access Memory) or any other functional memory technology that can be powered down, for storing data. A computer program containing instructions for the processing unit is, for example, intended to be loaded into the main memory, so that the processing unit executes its instructions to carry out the functions and the modules of the device 218 which are going to be described.

Alternatively, all or some of these functions and modules could be implemented in the form of hardware modules, i.e., in the form of an electronic circuit, for example micro-wired, not involving a computer program. For example, it could be a programmable logic circuit, such as a field-programmable gate array (FPGA).

The device 218 is first designed to supply an excitation signal SE to the coupling device 210 to generate, together with the auxiliary current I0, a total magnetic flux $\Phi$ which, in the absence of the compensation that will be described later, has a deformation resulting from the current magnetic flux $\Phi0$ from the current to be measured I0.

More specifically, the excitation signal SE causes an excitation magnetic flux $\Phi E$ to appear, to which the current magnetic flux $\Phi0$ is added. The excitation magnetic flux $\Phi E$ is designed to oscillate between a maximum and a minimum reaching the saturation areas Z+, Z− respectively. However, because of the current magnetic flux $\Phi0$, the total magnetic flux $\Phi$ ($\Phi E+\Phi0$) is shifted towards one of the two saturation areas Z+, Z− (depending on the sign of the auxiliary current I0) and is therefore deformed compared with the case where the auxiliary current I0 (and therefore the current magnetic flux $\Phi0$) is zero. In the latter case, the saturation is more or less identical for the maximum and the minimum, whereas with the auxiliary current I0, one of the maximum and the minimum is more saturated than the other.

The device 218 is further designed to supply a compensation signal Sc to the coupling device 210 so that a resulting compensation magnetic flux $\Phi c$ substantially cancels the current magnetic flux $\Phi0$.

In the example described, where a single coil 216 is used, these two signals SE, Sc are added together to form a single total signal, denoted St.

In order for this total signal St to produce the appearance of the flux of excitation $\Phi E$ and of compensation $\Phi c$, the device 218 comprises, in the example described, a digital-to-analogue converter 220 for converting the total signal St into a voltage Vt applied to the terminals of the impedance Z and of the coil 216. In this way, the voltage Vt generates a current i running through the impedance Z and the coil 216, so as to generate an excitation in the core 214.

To generate the excitation signal SE, the device 218 comprises, in the example described, a module 222 for generating an initial oscillating signal Se'. For example, the initial oscillating signal Se' is preferably formed by at least one sinusoid at a fundamental frequency and a sinusoid at the third harmonic, i.e., three times the fundamental frequency. For example, the initial oscillating signal is composed solely of these two sinusoids. Alternatively, the initial oscillating signal Se' could be a triangular signal comprising a sinusoid at a fundamental frequency and sinusoids at odd harmonics of this fundamental frequency, including in particular a sinusoid at the third harmonic.

To ensure that the saturation areas Z+, Z− are indeed reached, the device 218 is further designed, still in the example described, to multiply the initial oscillating signal Se' by a saturation servo coefficient K, in order to obtain an oscillating signal Se. The oscillating signal Se therefore comprises, like the oscillating signal Se', a sinusoid at the fundamental frequency and a sinusoid at the third harmonic. A way of calculating this coefficient K will be explained below.

The device 218 further comprises an encoding module 224 designed to encode data to be transmitted Tx into an initial encoded signal Sd' and an integrator 225 designed to integrate the initial encoded signal Sd' into an encoded signal Sd. The device 218 is then designed to sum the encoded signal Sd with the oscillating signal Se to form the excitation signal SE.

FIG. 4 shows an example of an oscillating signal Se, an initial encoded signal Sd', an encoded signal Sd and their sum SE.

Preferably, the initial encoded signal Sd' includes a clock signal. This makes it easier to recover the rhythm of the message and therefore the recovery of the data.

Even more preferably, the initial encoded signal Sd' has a mean of zero, and therefore also the encoded signal Sd. In this way, the portion of the excitation magnetic flux $\Phi E$ derived from the encoded signal also has zero mean, so as not to distort the current measurement, as will be explained later.

Even more preferably, the initial encoded signal Sd' is a square-wave signal. The use of square-wave is a simple way of representing binary data. These square-waves are converted by the 225 integrator into a sawtooth pattern (i.e., a triangular signal).

For example, the Manchester Bi-phase coding is used, this coding combining all three of the above characteristics.

Preferably, the initial encoded signal Sd' has a higher fundamental frequency than the oscillating signal Se.

Preferably, the initial encoded signal Sd' is present only outside portions P of the oscillating signal Se of predefined length, centred respectively on the maximum and the minimum of the oscillating signal Se. In this way, the initial encoded signal Sd' runs little risk of being deformed as a result of the saturation areas Z+, Z−.

It will also be appreciated if the oscillating signal Se comprises a sequence of rises and falls. Preferably, the initial encoded signal Sd' is only present on one of the rises and falls (the rises in the example shown). So, as will be explained later, the other of the rises and the falls can be used to receive data.

Returning to FIG. 2, in the example described, the total signal St is thus the sum of the encoded signal Sd, the excitation signal Se and the compensation signal Sc: St=Se+Sd+Sc=SE+Sc=Sd+K*Se'+Sc.

In order to determine the compensation signal Sc and the servo coefficient K, the device 118 is also designed to obtain a signal for measuring a variable of the coupling device which is sensitive to the deformation of the internal signal.

In the example described, the measured variable is a voltage Vm at the terminals of the coil 216. In fact, this voltage Vm is proportional to the derivative of the total magnetic flux $\Phi$ forming the internal signal, which corresponds substantially to a high-pass filtering. To measure the voltage Vm, the device 218 comprises, in the example described, an analogue-to-digital converter 226 to receive the voltage Vm as an input in order to convert it into a measurement signal Sm. The latter therefore has a fundamental frequency equal to that of the oscillating signal Se.

In the event of deformation resulting from the auxiliary current I0, a second harmonic appears in the Sm signal.

Thus, the device 218 also comprises a module 228 for extracting an amplitude of the second harmonic of the measured signal Sm. This extraction module 228 comprises, for example, a multiplier designed to multiply the measurement signal Sm with a clock H2 synchronised to the second harmonic, followed by a low-pass filter.

In addition, the device 218 is designed to set the compensation signal Sc from the amplitude of the second harmonic of the measurement signal Sm to cancel the deformation, i.e., so that the compensation magnetic flux $\Phi c$ compensates the current magnetic flux $\Phi 0$. This compensation therefore allows to cancel out the deformation of the total magnetic flux $\Phi$. In the example described, this means that the second harmonic of the measured signal Sm returns to zero. To do this, the device 218 comprises, in the example described, a module 230 for setting the compensation signal Sc from the amplitude of the second harmonic of the measurement signal Sm. The setting module 230 comprises, for example, a proportional-integral regulator.

The device 218 also comprises a current evaluation module 232 designed to evaluate the auxiliary current I0 and therefore also the supply current I from the compensation signal Sc.

To determine the coefficient K allowing the excitation magnetic flux CH to reach the two saturation areas Z+, Z−, the device 218 uses the property that, by judiciously choosing the ratio between the amplitudes of the sinusoids of the oscillating signal Se at the fundamental frequency and at the third harmonic, the third harmonic of the measurement signal Sm cancels out when the saturation areas Z+, Z− are reached. The device 218 therefore first comprises a module 234 for extracting the third harmonic from the measurement signal Sm. This extraction module 234 comprises, for example, a multiplier designed to multiply the measurement signal Sm with a clock H3 synchronised to the third harmonic, followed by a low-pass filter. The device 218 then comprises a module 236 for setting the coefficient K on the basis of the amplitude of the third harmonic of the measurement signal Sm. The setting module 236 comprises, for example, a proportional-integral regulator.

It will also be appreciated that the excitation signal SE generates, via the coupling device 210, a voltage Vpe at the primary of the transformer 212 (i.e., on the auxiliary branch 208) which propagates on the transmission line 118.

As explained previously, the monitoring device 130 is similar to the monitoring device 128 and transmits a voltage Vpr to the primary of the transformer 212. Preferably, the monitoring devices 128, 130 are synchronised with each other, for example by means of the clock signals transmitted with the coded signals Sd emitted by each of the monitoring devices 128, 130. This synchronisation allows the monitoring devices 128, 130 to create a standing wave in the transmission line 118 so that the voltages Vpe and Vpr are superimposed on each other in a stationary manner.

The measured voltage Vm is therefore representative of this stationary superposition, as is the measured signal Sm.

With reference to FIG. 5, the measurement signal Sm therefore comprises the sum of a periodic signal Se*, a transmitted encoded signal Sde* and a received encoded signal Sdr*.

The periodic signal Se* results from the excitation signals Se from the two monitoring devices 128, 130. This periodic signal Se* is, in the example described, substantially triangular with the rounded peaks because, on the one hand, the transformer 212 acts as a shunt which transforms the excitation signals Se and, on the other hand, the rounded peaks result from the saturation effects of the transformer 122 detailed above.

The transmitted encoded signal Sde* results from the encoded signal Sd transmitted by the monitoring device 128, while the received encoded signal Sdr* results from the encoded signal Sd transmitted by the monitoring device 130. In the example described, these coded signals, transmitted Sde* and received Sdr*, are in the form of square-waves due to the shunt function of the transformer 212, which transforms the sawtooth of the coded signals Sd into square-waves.

Returning to FIG. 2, it will be appreciated that the measurement signal Sm is sensitive to the presence of a fault on the transmission line 118. When the current sensor 202 is operating, the compensation of the magnetic current flux is effective, so that everything happens in the coupling device 210 essentially as if the auxiliary current I0 and the compensation signal were zero. The core 214 is run through only by the excitation magnetic flux, which extends substantially in the linear area between the two saturation areas Z+, Z−. The secondary voltage Vm and the current i are therefore at the primary (within one ratio) and therefore on the auxiliary branch 208, which creates a signal propagating on the transmission line 118. Because the excitation signal SE comprises the encoded signal Sd, the propagating signal includes the data Tx to be transmitted, which can thus reach the other monitoring system 130. In addition, all the elements connected to the primary of the transformer 212, and in particular the transmission line 118, define an input impedance of the transformer 212. In the event of a fault on the transmission line 118, the input impedance of the transformer is modified, resulting in a change in the primary voltage and therefore in the secondary voltage Vm.

This property is used to detect a fault on the transmission line 118. The device 218 is also designed to analyse the measurement signal Sm corresponding to the secondary voltage Vm and to detect a fault on the transmission line 118 on the basis of this analysis.

To do this, the analysis of the measurement signal Sm comprises in particular a comparison of the measurement signal Sm with at least one template and the detection of the fault on the transmission line 118 is carried out on the basis of parts of the measurement signal Sm outside at least one of the template or templates.

In the example described, two templates are used.

With reference to FIG. 6, a global template GB is first used, for example to detect partial discharges and electric arcs (arc tracking) in the transmission line 118. This global template GB tracks, above and/or below, variations in the oscillating signal Se* and in an envelope of the coded signals Sde*, Sdr*.

Returning to FIG. 2, the device 218 comprises a module 238 for comparing the measurement signal Sm with the global template GB. Every time the measurement signal Sm leaves this global template GB, it is stored in an accumulator 240. In the scope of a digital processing where the measurement signal Sm is sampled, these instants are those of the samples whose values are outside the global GB template.

The device 218 then comprises a statistical analysis module 242 designed to carry out a statistical analysis of the output instants of the global template GB accumulated to detect a fault on the transmission line 118. This detection is indicated by the reference D1 in FIG. 2. Thus, when the output instants of the global template GB are too numerous, the statistical analysis module 242 deduces the presence of a problem on the line, in particular of a partial discharge and/or an electric arc. For example, there are too many outputs from the global template GB when, in a predefined interval, a ratio between a cumulative duration of these outputs from the global template GB and a total duration of the interval is greater than a predefined threshold. This threshold is between 2% and 10%, for example 5%. In the example described where the processing is digital, the statistical analysis module 242 counts, for example, the number of samples of the measurement signal Sm in the predefined interval which are outside the global template GB, calculates the ratio of this number of samples counted and of the total number of samples in the interval and compares this ratio with the predefined threshold.

The statistical analysis module 242 can also be designed to analyse a change over time in a frequency spectrum of the measurement signal Sm. More specifically, the statistical analysis module 242 is designed to search for a high-frequency peak and to determine its amplitude and its duration. An electric arc will produce a high-amplitude high-frequency peak that persists over time. In contrast, a partial discharge produces a short, low-amplitude high-frequency peak. So when a high-frequency peak is found, a problem on the line is detected. In addition, depending on the amplitude and on the duration of this high voltage peak, the statistical analysis module 242 distinguishes between a partial discharge and an electric arc. For example, when the amplitude and the duration of the high-frequency peak are below respective predefined thresholds, a partial discharge is detected, while when the amplitude and the duration of the high-frequency peak are respectively above these thresholds, an electric arc is detected. The frequency of the peak sought depends on the intrinsic characteristics of the line and of the end elements. Generally, the peak will be sought in the frequencies above 10 MHz. Preferably, the search should be limited to the frequencies below 100 MHz, as the attenuation above 100 MHz is generally too great and therefore insignificant. For example, the search for the peak is carried out in the 10 MHz-100 MHz interval or in one or more intervals within the interval 10 MHz-100 MHz.

Preferably, the statistical analysis module 242 is designed to analyse a recurrence of this abnormal high-frequency peak or peaks found. When they first appear, the phenomena are generally highly transient, characteristic of temporary disturbances with no operational impact. On the other hand, if the recurrence satisfies a condition indicating that it is becoming too frequent (for example, when the recurrence falls below a predefined threshold), problems with the connection, or even failure of the latter, are likely to occur in the near future. An alert is therefore preferably generated by the statistical analysis module 242 in this case. This alert is intended to be displayed on a screen or by an indicator light, for example. The predefined recurrence threshold is, for example, between 2 and 10 peak detections per hour of operation of the transmission line.

With reference to FIG. 7, a precise template GP is also used. This precise template GP tracks, above and/or below, the variations in the Sde*, Sdr* data signals. It is therefore preferably established in real time as a function of the data transmitted Tx and received Rx.

Returning to FIG. 2, the device 218 comprises a module 244 for comparing the measurement signal Sm with the precise template GP. Each instant when the measurement signal Sm leaves this precise template GP is stored in an accumulator 246. In this way, the output times are representative of an amplitude dispersion of the measurement signal Sm. In the scope of a digital processing where the measurement signal Sm is sampled, these instants are those of the samples of the measurement signal Sm whose values are outside the precise template GP.

The device 218 then comprises a statistical analysis module 248 designed to carry out a statistical analysis of the output instants of the precise template GP accumulated to detect a fault on the transmission line 118. This detection is indicated by the reference D2 in FIG. 2.

With reference to FIG. 8, the statistical analysis module 248 is, for example, also designed to detect a degradation of the shielding 124 of the coaxial cable.

If the shielding 124 is locally damaged, the propagating signal will encounter an impedance at this point that differs from the normal characteristic impedance of the coaxial cable. Depending on whether the impedance encountered is higher or lower than the normal characteristic impedance, the signal will be amplified or attenuated over a part of a level of an encoded signal Sde* or Sdr*. As a result, this part will be shifted from the rest of the level. Thus, the module 248 can be designed to determine the presence of this shifted portion and to determine the length (i.e., the duration t) of this shifted portion. If the module 248 detects the presence of a shifted part, it can then be designed to locate the fault along the transmission line 118 on the basis of the time t and known characteristics of the transmission line 118.

Returning to FIG. 2, it will also be appreciated that the measurement signal Sm comprises a sequence of rises and falls corresponding respectively to the rises and falls of the oscillating signal Se. Thus, in the example described, the data processing device 218 further comprises a module 250 for decoding the encoded signal Sdr* present on the other among the rises and the falls of the measurement signal Sm. This encoded signal Sdr* comprises data Rx from the monitoring system 130 which is identical to the monitoring system 128.

In this way, the monitoring systems 128, 130 can exchange data.

Preferably, the same measurements (current and/or transmission line fault) are carried out identically and simultaneously at each end of the transmission line, by the respective monitoring systems 128, 130. The monitoring systems 128, 130 then communicate with each other, so that it is possible to communicate a global and redundant status of the transmission line concerned to the central members of the aircraft. If there is a difference between the two measurements, the system may be declared faulty and taken out of service, isolated from the rest of the electrical distribution system.

Still referring to FIG. 2, the device 218 comprises a module 252 for analysing the measurement signal Sm to detect a degradation of the insulation 122 of the coaxial cable. This detection is labelled D3 in FIG. 2.

With reference to FIG. 8, the portions of the measurement signal Sm comprising the encoded signal Sdr* normally have rising and falling edges resulting from the square-wave form of this encoded signal Sdr*. These rising and falling edges therefore have very short rise times tm and fall times td. As the insulation 122 deteriorates, the rise time tm and fall time td increase. For example, the statistical analysis module 248 is designed to determine and track the changes in the rise time tm and fall time td in order to deduce a degradation of the insulation 122 over time, in other words ageing of the cable, which has repercussions on the dielectric characteristics of the cable. In particular, the high-frequency losses are likely to increase.

The accumulation of the determinations of the rise time tm and fall time td over the life of the coaxial cable allows to track the ageing of the cable and measure its speed.

The analysis module 252 can be designed to compare these rise times tm and fall times td with respective predefined thresholds allowing to determine, if they are exceeded, when it would be prudent to replace the transmission line 118.

There are many causes of cable insulation degradation, including high operating temperatures.

With reference to FIG. 10, a further example of the implementation of the monitoring system 128 will now be described. The monitoring system 130 can also be designed in this way.

The monitoring system 128 in FIG. 10 is similar to that in FIG. 2, except that the impedance Z is connected between the first end of the coil 216 and the electrical mass. Furthermore, in this embodiment, the voltage Vm is measured on the terminals of the impedance Z. The voltage Vm is thus proportional to the integral of the total magnetic flux Φ forming the internal signal, which corresponds substantially to a low-pass filtering. This facilitates the analogue-to-digital conversion by the converter 226, as the associated frequency spectrum is naturally limited to the low frequencies.

It is clear that a monitoring system according to the invention allow to measure the current of the transmission line, as well as detect a fault in this transmission line.

It should also be noted that the invention is not limited to the embodiments described above by way of example. It encompasses various modifications, alternative forms or other variants that may be envisaged by the person skilled in the art, within the scope of the invention.

For example, the analysis modules 242, 248 could use self-learning and artificial intelligence methods based on the intrinsic data obtained.

These modules could also be designed to receive and use other data such as environmental temperatures, pressure (or altitude) parameters, vibration levels and any other parameter that could influence the health of the transmission line being monitored.

In the detailed presentation of the invention given above, the terms used should not be interpreted as limiting the invention to the embodiments set out in this description, but should be interpreted to include all equivalents the anticipation of which is within the reach of the person skilled in the art by applying his general knowledge to the implementation of the invention.

The invention claimed is:

1. A system for monitoring a transmission line connected to a positive terminal (+) of a DC voltage source by a positive connection and to a negative terminal (−) of the DC voltage source by a negative connection, comprising:
   a coupling device connected to the positive connection, but not to the negative connection, to receive a current to be measured (I0) conveyed by the positive connection of the transmission line and originating from the positive terminal (+) of the DC voltage source; and
   a data processing device connected to the coupling device and designed for:
      supplying an excitation signal (SE) to the coupling device so that an internal signal (Φ) appears in the coupling device, this internal signal (Φ) having a deformation resulting from the current to be measured (I0),
      obtaining a signal (Sm) for measuring a variable (Vm) of the coupling device sensitive to the deformation of the internal signal (Φ),
      supplying a compensation signal (Sc) to the coupling device from the measurement signal (Sm) to cancel the deformation, and
      evaluating the current to be measured (I0) from the compensation signal (Sc);
   wherein the measurement signal (Sm) being additionally sensitive to the presence of a fault on the transmission line, the data processing device is additionally designed to analyse the measurement signal (Sm) and to detect, from this analysis, a fault on the transmission line.

2. The system according to claim 1, wherein the coupling device comprises a transformer with a ferromagnetic core, the internal signal being a total magnetic flux (Φ) present in the core and grouping together an excitation magnetic flux (ΦE) resulting from the excitation signal (SE), a current magnetic flux (Φ0) resulting from the current to be measured (I0) and a compensation magnetic flux (Φc) resulting from the compensation signal (Sc) so as to substantially cancel the current magnetic flux (Φ0).

3. The system according to claim 1, wherein the analysis of the measurement signal (Sm) comprises comparing the measurement signal (Sm) with at least one template (GB, GP) and wherein the detection of the fault on the transmission line is carried out from instants at which the measurement signal (Sm) is outside at least one of the template or templates (GB, GP).

4. The system according to claim 1, wherein the excitation signal (SE) comprises an oscillating signal (Se).

5. The system as claimed in claim 4, wherein the oscillating signal (Se) comprises a sum of a sinusoid at a fundamental frequency and a sinusoid at the third harmonic, i.e., at three times the fundamental frequency.

6. The system according to claim 1, wherein, the excitation signal (SE) generating, through the coupling device, a signal propagating on the transmission line, the data processing device is further designed to encode data to be transmitted (Tx) into an encoded signal (Sd) and wherein the excitation signal (SE) comprises the encoded signal (Sd) so that the propagating signal includes the data (Tx) to be transmitted.

7. The system according to claim 6, wherein the encoded signal (Sd) has a mean of zero.

8. The system according to claim 6, wherein the encoded signal (Sd) has a higher fundamental frequency than that of the oscillating signal (Se).

9. The system according to claim 8, wherein the at least one template comprises a global template (GB) which tracks, on the one hand, variations of an oscillating signal (Se*) of the measurement signal (Sm) resulting from the oscillating signal (Se) of the excitation signal (SE) and, on the other hand, an envelope of an encoded signal (Sde*) of the measurement signal (Sm) resulting from the encoded signal (Sd) of the excitation signal (SE).

10. The system according to claim 8, wherein the at least one template comprises a local template (GP) tracking variations of an encoded signal (Sde*) of the measurement signal (Sm) resulting from the encoded signal (Sd) of the excitation signal (SE).

11. The system according to claim 1, wherein the oscillating signal (Se) comprises a sequence of rises and falls and wherein the encoded signal (Sd) is present only on one of the rises and the falls.

12. The system according to claim 11, wherein the measurement signal (Sm) comprises a sequence of rises and falls corresponding respectively to the rises and falls of the oscillating signal (Se) and wherein the data processing device is further designed to decode an encoded signal present on the other of the rises and the falls of the measurement signal (Sm).

13. The system according to claim 1, wherein the transmission line is a coaxial cable.

14. An electrical distribution system comprising:
an electrical source;
an electrical load;
a transmission line connecting the electrical load to the electrical source, so that the electrical source supplies electrical power to the electrical load;

a system for monitoring the transmission line according to claim 1.

15. The electrical distribution system as claimed in claim 14, wherein the electrical source is a DC voltage source, preferably greater than 100 V.

16. An aircraft comprising an electrical distribution system according to claim 14.

17. The system according to claim 1, wherein the ferromagnetic core is a closed-loop ferromagnetic core, wherein the positive connection comprises a branch conveying the current to be measured (I0) and passing through the closed-loop ferromagnetic core to form a primary of the transformer, while the negative transmission line does not pass through the closed-loop ferromagnetic core.

18. A method for monitoring a transmission line connected to a positive terminal (+) of a DC voltage source by a positive connection and to a negative terminal (−) of the DC voltage source by a negative connection, comprising a current sensor (202) comprising a coupling device connected to the positive connection, but not to the negative connection, for receiving a current to be measured (I0) conveyed by the transmission line and originating from the positive terminal (+) of the DC voltage source, comprising:

supplying an excitation signal (SE) to the coupling device so that an internal signal (Φ) appears in the coupling device, this internal signal (Φ) having a deformation resulting from the current to be measured (I0), obtaining a signal (Sm) for measuring a variable (Vm) of the coupling device sensitive to the deformation of the internal signal (Φ), supplying a compensation signal (Sc) to the coupling device from the measurement signal (Sm) to cancel the deformation; and evaluating the current to be measured (I0) from the compensation signal (Sc);

wherein the measurement signal (Sm) being further sensitive to the presence of a fault on the transmission line, the method further comprises analysing the measurement signal (Sm) and detecting, from this analysis, a fault on the transmission line.

19. A computer program downloadable from a communication network and/or stored on a non-transitory computer-readable medium, wherein it comprises instructions for executing the steps of a method according to claim 18, when said program is executed on a computer.

* * * * *